United States Patent
Ain-Kedem et al.

(10) Patent No.: US 8,103,806 B1
(45) Date of Patent: Jan. 24, 2012

(54) METHOD AND APPARATUS FOR UTILIZING DEVICE ACCESS IDLE TIME FOR INPUT SENSING

(75) Inventors: Liron Ain-Kedem, Tivon (IL); Nir Leshem, Tivon (IL)

(73) Assignee: Zoran Corporation, Sunnyvale, CA (US)

( * ) Notice: Subject to any disclaimer, the term of this patent is extended or adjusted under 35 U.S.C. 154(b) by 338 days.

(21) Appl. No.: 12/126,573

(22) Filed: May 23, 2008

Related U.S. Application Data

(60) Provisional application No. 61/022,181, filed on Jan. 18, 2008.

(51) Int. Cl.
*G06F 3/00* (2006.01)
(52) U.S. Cl. .................. 710/15; 710/8; 710/17; 710/18
(58) Field of Classification Search ................ 710/8, 12, 710/15, 17, 18
See application file for complete search history.

(56) References Cited

U.S. PATENT DOCUMENTS

| | | | | |
|---|---|---|---|---|
| 5,017,813 | A | * | 5/1991 | Galbraith et al. ............... 326/63 |
| 6,044,412 | A | | 3/2000 | Evoy |
| 6,094,711 | A | | 7/2000 | Wong |
| 6,721,840 | B1 | * | 4/2004 | Allegrucci ..................... 710/306 |
| 2005/0223121 | A1 | * | 10/2005 | Tsai ................................. 710/2 |
| 2005/0246477 | A1 | * | 11/2005 | Adams et al. ................. 710/315 |
| 2006/0101173 | A1 | * | 5/2006 | Cheng et al. .................... 710/58 |

\* cited by examiner

*Primary Examiner* — Henry Tsai
*Assistant Examiner* — Kris Rhu
(74) *Attorney, Agent, or Firm* — Lando & Anastasi, LLP

(57) ABSTRACT

A circuit capable of reading an input from a device on one pin of an integrated circuit package during one time period and either writing data to another device or reading an input from the other device through the same pin during another time period. In one exemplary implementation in which the one pin is used to write data to the other device, the circuit may sense when data is not being written and change the function of the one pin from that of an output pin to that of an input pin until such time as further data is to be written.

23 Claims, 4 Drawing Sheets

METHOD AND APPARATUS FOR UTILIZING DEVICE ACCESS IDLE TIME FOR INPUT SENSING

RELATED APPLICATIONS

This application claims priority under 35 U.S.C. §119(e) to U.S. Provisional Application Ser. No. 61/022,181, entitled "USING GENERAL-PURPOSE OUTPUT AS INPUTS," filed on Jan. 18, 2008, which is herein incorporated by reference in its entirety.

BACKGROUND OF INVENTION

1. Field of Invention

The present invention relates to circuits for reading and writing data to and from devices, and more particularly to reduced pin count integrated circuits and methods of reducing the pin count in a device capable of writing data to and reading data from external devices.

2. Discussion of Related Art

As consumer electronic devices and other devices containing integrated circuits shrink in physical size due to consumer preference, power savings considerations, etc., the integration density of integrated circuits (ICs) within these devices increases. In many instances, designs of certain types of integrated circuits or electronic devices have become pin count limited. The number of input/output (I/O) pins on a final IC package are often desired to be as low as possible, and in some instances a single additional pin may make the difference between a go or no go decision for inclusion of a certain IC in a particular product. Further, in many device types, as the cost of semiconductor die production continues to drop over time, the cost of the device packaging is becoming a larger portion of the cost of the entire packaged IC. Thus, the savings in packaging costs by the reduction in pin count of the final assembled device is having a greater and greater impact on the total device cost.

As the limit on the number of I/O pins allowed on an integrated circuit package decreases, this may limit the potential functionality of the integrated circuit. This makes it desirable to modify the device design to impart more functionality per pin. In some integrated circuits, software may be utilized to instruct a device to switch the functionality of one or more pins in different time intervals to carry input or output signals for more than one external device, or to periodically switch one or more pins from performing an output function to performing an input function. These solutions may in some instances put a significant load on the processing ability of the associated device or devices.

SUMMARY OF INVENTION

The present invention relates to the utilization of at least one pin of a packaged integrated circuit to both read data from a first device and write data to a second device or to both read data from a first device and read data from a second device that is different than the first device. The circuit configuration may in some embodiments provide a hardware based solution that may utilize one or more pins to automatically sample a general purpose output of a first device when the pins are not actively accessing (i.e., writing data to or reading data from) a second device. In some embodiments, the first and second devices may be different devices in the same or different products, different devices included in a single packaged integrated circuit, or even different circuits within a single packaged integrated circuit.

Certain embodiments of the present invention are directed to a system and method of periodically using pins normally dedicated to output functions as input pins without significantly burdening the processing ability of the associated device or devices. In some embodiments, such pin function reassignments may be made utilizing internal hardware based solutions, which has the advantage of allowing a device to function more quickly and utilize less power than an equivalent device where such pin reassignments are performed in response to software commands.

In accordance with one aspect of the present invention, an integrated circuit having a plurality of terminals is provided. The integrated circuit comprises a memory, a first terminal to access a first device, a second terminal having a first state when the first terminal is accessing the first device and having a second state when the first terminal is not accessing the first device, and a logic circuit. The logic circuit is coupled to the first terminal, the second terminal, and the memory, and is configured to sense a data value provided on the first terminal by a second device that is different than the first device and store the value in the memory in response to the second terminal having the second state. In accordance with one embodiment, the first terminal of the integrated circuit may one of read data from the first device and write data to the first device.

In accordance with another aspect of the present invention, a method of processing signals in a circuit having a plurality of terminals is provided. The method comprises acts of accessing a first device using a first terminal of the circuit during a first interval in which a second terminal of the circuit has a voltage level having a first state, reading a data value provided on the first terminal by a second device that is different than the first device during a second interval in which the second terminal of the circuit has a second state, different than the first state, and storing a representation of the data value in a memory. In accordance with this aspect of the present invention, the act of accessing the first device may include one of reading data from the first device or writing data to the first device.

According to another aspect of the present invention, a method of processing signals in a circuit having a plurality of I/O terminals is provided. The method comprises acts of providing an output signal on a first terminal of the circuit during a first interval in which a second terminal of the circuit has a voltage level having a first state, determining whether the voltage level of the second terminal has a second state, different than the first state, reading, responsive to the act of determining that the voltage level of the second terminal has the second state, an input signal on the first terminal during a second interval, and storing a representation of the input signal.

According to yet another aspect of the present invention, an integrated circuit having a plurality of terminals is provided. The integrated circuit comprises a memory, a first terminal to provide a first output signal and to receive a first input signal, a second terminal to provide a second output signal having a first state indicative of when the first terminal is providing the first output signal and having a second state indicative of when the first terminal is not providing the first output signal, and a logic circuit coupled to the first terminal, the second terminal, and the memory. The logic circuit is configured to sense a value of the first input signal and store the value in the memory in response to the second output signal having the second state.

In accordance with another aspect of the present invention, a method of processing signals in a circuit having a plurality of terminals is provided. The method comprises acts of providing a first signal on a first terminal of the circuit during a first interval in which a second terminal of the circuit has a voltage level having a first state, receiving a second signal indicative of whether the voltage level of the second terminal has a second state different than the first state, reading, responsive to the act of receiving the second signal, a third signal on the first terminal during a second interval, and storing a representation of the third signal in a memory.

An electronic system according to another aspect of the present invention comprises an input/output pad, a device control circuit, a memory, and a sampling circuit. The input/output pad has a first state in which data can be provided to a first electronic circuit and has a second state during which a signal can be received from a second electronic circuit, different than the first electronic circuit. The device control circuit is electrically coupled to the input/output pad to control the data provided to the first electronic circuit via the first input/output pad. The memory stores a value of the signal received from the second electronic circuit. The sampling circuit is electrically coupled to the device control circuit, the memory, and the input/output pad, and comprises circuitry configured to change the state of the first input/output pad from the first state to the second state, to sample the value of the signal received from the second electronic circuit, and to write the value of the signal to the memory in response to a control signal that data is not currently being provided to the first electronic circuit by the device control circuit.

According to a further aspect of the present invention, a method of utilizing a single terminal of an electronic circuit to supply an input signal to a first device and to read an output signal from a second device is provided. The method comprises providing a circuit comprising a sampling unit, a memory, and a device control unit, sending a first signal from the device control unit to the sampling unit in response to a change in voltage of an indicator signal, responsive to the receipt of the first signal at the sampling unit, changing the flow of data along an input/output signal path from an initial direction to a second direction, sending a signal from the sampling unit to a delay timer, responsive to the expiration of the delay timer, reading a value of a signal on the input/output signal path, writing the value of the signal on the input/output signal path to the memory, and changing the flow of data along the input/output signal path from the second direction to the initial direction.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
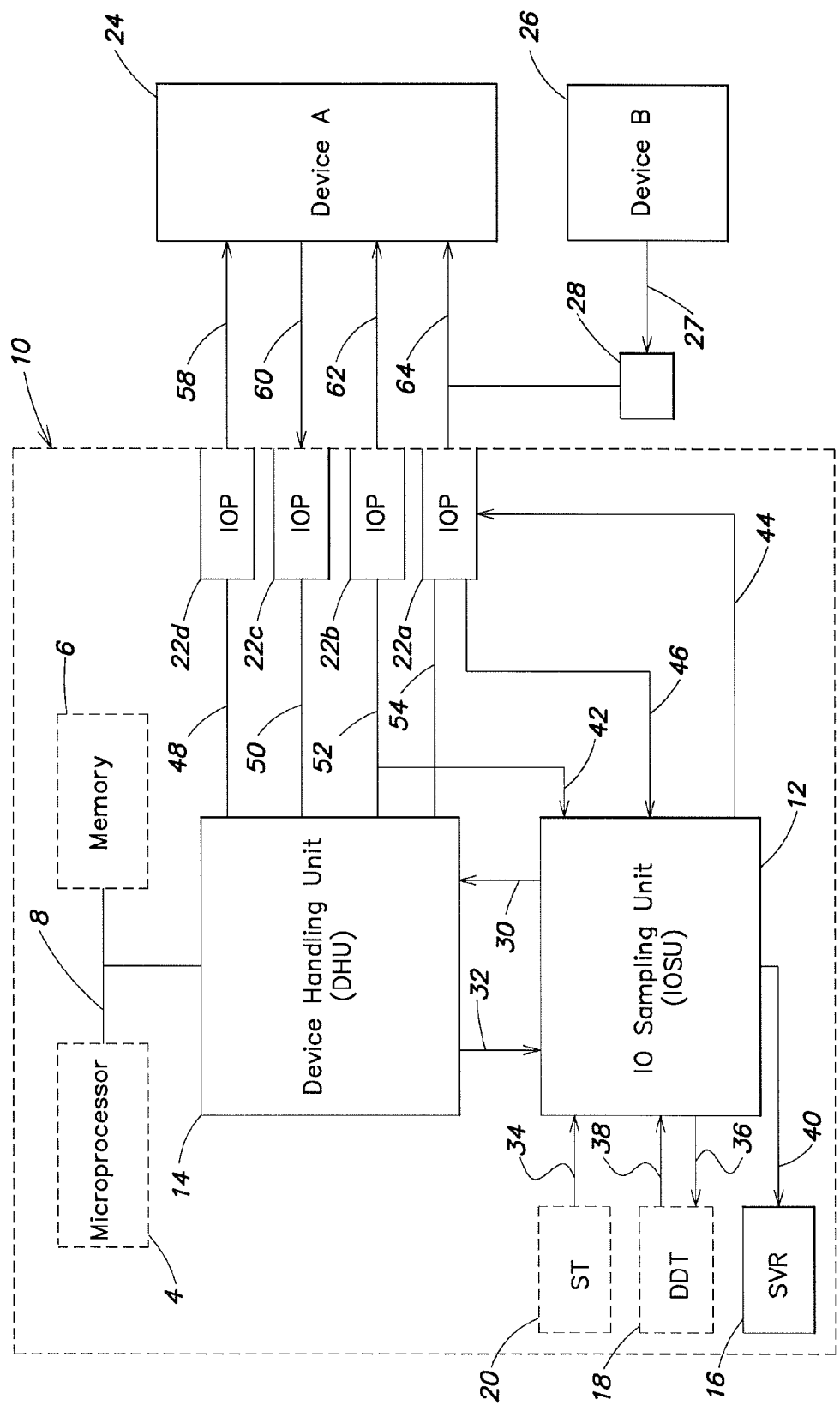
FIG. 1 is a block diagram of a circuit according to an embodiment of the present invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items. The terms "terminal," "pin," "pad," and "I/O pad" are used interchangeably herein.

Embodiments of the present invention are directed to an integrated circuit capable of both reading data from and writing data to a specific one of a plurality of I/O pads. The integrated circuit includes circuitry that may monitor the flow of data through an I/O pad to determine when the I/O pad is being utilized for transmitting data to a first external device. When the I/O pad is not in use for transmitting data to a first external device, the integrated circuit may use the I/O pad to read data from a second external device. Upon completion of the data reading operation, the I/O pad may be utilized as an output once again.

Referring to FIG. 1, there is shown a block diagram of an exemplary circuit according to an embodiment of the present invention, referenced generally by reference numeral 10. The circuit 10 may be realized in the form of an integrated circuit enclosed in a package having a plurality of input/output (I/O) pads. The circuit 10 includes an I/O Sampling Unit (IOSU) 12, a Device Handling Unit (DHU) 14, a Signal Value Register (SVR) 16, and an I/O Pad (IOP) 22a. I/O Pad 22a is described in more detail below with reference to FIG. 4. Signal paths between these units are represented by lines 30, 32, 40, 42, 44, 46, and 54. The various circuitry elements 12, 14, 16, and 22a may be fabricated on a single integrated circuit die.

The I/O Sampling Unit 12 is utilized to sample an output from a device external to circuit 10 and may be implemented in any form of programmed or programmable logic. The I/O Sampling Unit 12 interfaces with the Device Handling Unit 14 that controls a device or devices external to the circuit 10. The I/O Sampling Unit 12 interfaces with I/O Pad 22a to change the flow of data through I/O Pad 22a from writing data to an external device to reading data from an external device. The I/O Sampling Unit 12 also interfaces with Signal Value Register 16 to store data read from an external device.

According to some embodiments, external to circuit 10 are one or more electronic devices—Device A 24 and Device B 26. These devices are electrically coupled to electrical circuit 10 through lines 58, 60, 62, 64 which are electrically coupled to circuit 10 through respective I/O Pads 22a-22d of a package in which circuit 10 resides. For example, lines 48, 58 may carry a clocking signal, lines 50, 60 may carry an input signal from Device A 24 to Device Handling Unit 14, and lines 52, 62 may carry a chip select or chip enable indicator signal. Line 54 may carry an output signal from Device Handling Unit 14 through I/O Pad 22a to Device A 24 along line 64 in one mode of operation. In another mode of operation, line 64 may carry an output signal from Device B 26 to I/O Pad 22a, and line 46 may carry the signal to I/O Sampling Unit 12. Device B 26 is coupled to line 64 along line 27 which includes resistor 28. Resistor 28 functions to reduce the strength of an output signal from Device B 26 to ensure that operation of Device A 24 is not disturbed by Device B 26.

In some embodiments, additional circuit elements may be present in circuit 10. For example, in some embodiments, circuit 10 may include a microprocessor 4 with an associated memory 6. The microprocessor 4 communicates with memory 6 and Device Handling Unit 14 along a bus 8. In some embodiments, Signal Value Register 16 may be a part of memory 6 or may be a register within microprocessor 4. The microprocessor 4 may be any type of programmable general purpose Processor or a programmable Digital Signal Processor (DSP), available from companies such as Intel, Analog Devices, Motorola, or Texas Instruments, or an application specific processor or DSP designed for a particular application and provided by a company such as Zoran Corporation. The memory 6 generally includes a combination of RAM memory and ROM memory, but may also include other types of memory, such as flash or disk-based memory, etc.

Some embodiments of the circuit 10 according to the present invention may further include a Direction Delay Timer (DDT) 18 and/or a Sampling Timer (ST) 20, which may communicate with I/O Sampling Unit 12 along signal lines 34, 36, and 38. In such embodiments, Sampling Timer 20 is used to provide a delay between times at which I/O Sampling Unit 12 reads or attempts to read data input from an external device. This is useful when the external device output read by I/O Sampling Unit 12 changes infrequently and reading of the output of Device B 26 during each interval in which data is not being written to or read from Device A 24 would be unnecessary and possibly a waste of circuit resources. Direction Delay Timer 18 is used to provide a delay between the time at which I/O Sampling Unit 12 signals the I/O Pad 22a that it desires to read an output from an external device (e.g., Device B 26) and the time that it actually performs the reading operation. This is useful to ensure that I/O Pad 22a has had sufficient time to switch direction from providing an output signal to providing an input signal and to help ensure that any data that is read is valid.

In some embodiments all of the circuit elements 4, 6, 12, 14, 16, 18, and 20 may be fabricated on a single die and packaged together in a single package including I/O Pads 22a-22d. In alternate embodiments, any of these circuit elements may be fabricated on separate die, some of which may be external to an integrated circuit package containing one or more of the other circuitry elements.

In some embodiments, Device A 24 and Device B 26 may be different circuits within a single device, and in some embodiments they may be completely separate devices either in the same product as circuit 10, or in different products. In accordance with one embodiment, Device A 24 may be a Serial Flash memory device. In this embodiment, Device Handling Unit 14 may function as a Serial Flash Handling Unit (SFU). In this embodiment, lines 48, 58 may carry a clocking signal (SFCLK) for the Serial Flash memory device, lines 50, 60 may carry a Data Input signal (SFDI) from the Serial Flash memory device to the Serial Flash Handling Unit, and lines 52, 62 may carry a Chip Select or chip enable indicator signal (SFCS). Line 54 may carry a Data Output signal (SFDO) from the Serial Flash Handling Unit through I/O Pad 22a to Serial Flash memory device along line 64 in one mode of operation. In another mode of operation, line 64 may carry a General Purpose Output signal (GPO) from Device B 26 to I/O Pad 22a, and line 46 may carry the General Purpose Output signal to I/O Sampling Unit 12.

Device A 24 may be configured to receive data input in the form of burst mode data transmissions. In between burst transmissions of data to Device A 24, I/O Pad 22a, through which the data to Device A 24 passes, may be utilized to read data from Device B 26. Device B 26 may be a device with an output that changes only occasionally or at a slow rate. For example, an output of Device B may indicate a power on or off condition of some internal or external circuit, or may indicate a fault state of an associated piece of electronic equipment, such as a paper empty condition on a computer printer. In these instances, sampling of the output of Device B 26 need not take place continuously or every time I/O Pad 22a is not being utilized to transmit output data to Device A 24.

The operation of an embodiment of I/O Sampling Unit 12 of circuit 10 according to the present invention is now described with reference to flowchart 100 in FIG. 2. Flowchart 100 contains a number of optional acts, shown outlined by dashed lines, which are performed in some embodiments of circuit 10 which include, for example, Direction Delay Timer 18 and Sampling Timer 20.

Figure 2:
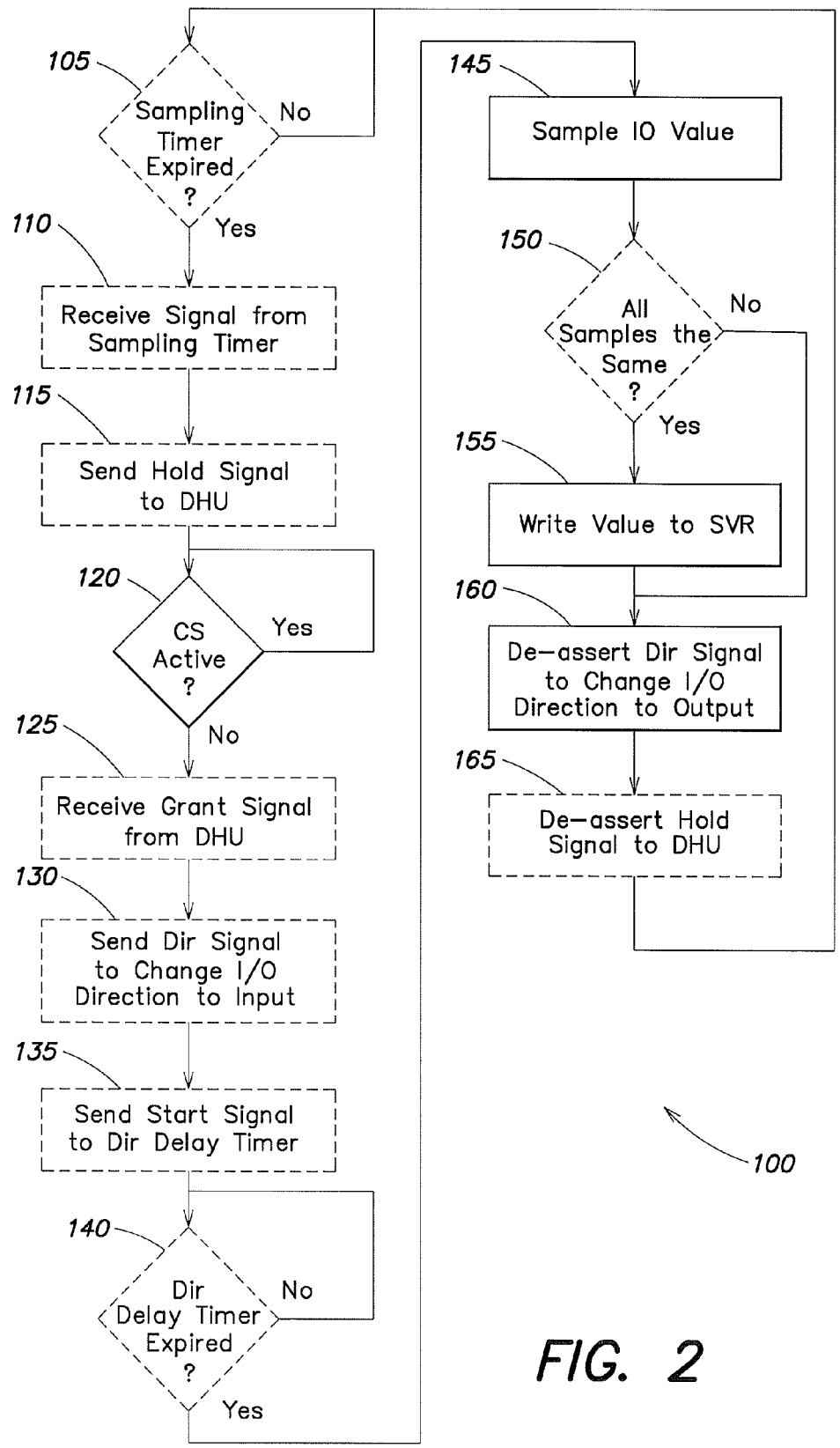
FIG. 2 is a flow chart of a method of operation of the circuit of FIG. 1.

Referring now to FIG. 1 and flowchart 100 of FIG. 2, in operation, Device Handling Unit 14 may write data along line 54, either continuously or periodically, while Sampling Timer 20 is counting down (act 105 of FIG. 2). Data need not be sent along line 54 at all times while Sampling Timer 20 is counting down, and data may be written to Device A 24 by Device Handling Unit 14 in a burst mode fashion.

Responsive to the expiration of Sampling Timer 20, Sampling Timer 20 sends a signal to I/O Sampling Unit 12 along line 34 (act 110 of FIG. 2). Responsive to receipt of this signal, I/O Sampling Unit 12 sends a hold signal along line 30 to Device Handling Unit 14 (act 115 of FIG. 2). This hold signal indicates to Device Handling Unit 14 that I/O Sampling Unit 12 is requesting permission to access I/O line 64 to read data from Device B 26. If Device Handling Unit 14 is in the process of writing data along lines 54, 64 to Device A 24, then the chip select indicator signal on line 52 will be in an active state. Responsive to the completion of writing data from Device Handling Unit 14 to Device A 24, Device Handling Unit 14 deactivates the chip select indicator signal along line 52, and Device Handling Unit 14 sends a grant signal along line 32 to I/O Sampling Unit 12 (act 125 of FIG. 2), indicating that I/O Sampling Unit 12 may safely access I/O line 64.

Responsive to receipt of the grant signal from Device Handling Unit 14, I/O Sampling Unit 12 sends a direction change signal to I/O Pad 22a along line 44 instructing I/O Pad 22a to change from being an output path for data from Device Handling Unit 14 to Device A 24 to being an input path for data output from Device B 26 to I/O Sampling Unit 12 (act 130 of FIG. 2). In this embodiment, I/O Sampling Unit 12 also sends a start signal to Direction Delay Timer 18 and waits for a response from Direction Delay Timer 18 (acts 135 and 140 of FIG. 2). Responsive to receipt of an expiration signal from Direction Delay Timer 18 at act 140, I/O Sampling Unit 12 reads a data value or a signal from line 64 through I/O Pad 22a along line 46 (act 145 of FIG. 2). Awaiting an expiration signal from Direction Delay Timer 18 before I/O Sampling Unit 12 reads input data helps to ensure that the input data is valid and that the direction of the I/O Pad 22a has been changed from output to input. The signal or data value from Device B 26 may be sampled once, or in some embodiments, a number of times by I/O Sampling Unit 12. By taking multiple samples of the signal or data value, I/O Sampling Unit 12 may perform an error check routine to ensure that the data value or signal was read accurately. In some embodiments of an error check routine, I/O Sampling Unit 12 may perform successive acts of data sampling until it either receives a specified number of successive identical readings, or until it reaches a maximum number of attempts, whichever comes first (act 150 of FIG. 2).

Responsive to the sampling of the data value or signal, I/O Sampling Unit 12 writes the data value or sampled signal to Signal Value Register 16 along line 40 (act 155 of FIG. 2). However, in certain embodiments where an error check is performed and an error in the data reading act is encountered, no new data will be written to Signal Value Register 16 and the prior value may be retained.

Signal Value Register 16 may be any form of memory circuitry or memory storage unit known in the art, including, for example, RAM, flash memory, a hard drive, magnetic core memory, or a register of microprocessor 4 or memory 6. In some embodiments, I/O Sampling Unit 12 may perform processing of the signal or data value before writing data to Signal Value Register 16. Signal Value Register 16 may hold the data sent by I/O Sampling Unit 12 for use by, for example, microprocessor 4, by another CPU, or by some other external or internal circuit or electronic device.

After sampling the data or signal from Device B 26, I/O Sampling Unit 12 sends another signal to I/O Pad 22a instructing I/O Pad 22a to change direction and thereby cease permitting data output from Device B 26 to reach I/O Sampling Unit 12 and to allow data output from Device Handling Unit 14 to reach Device A 24 (act 160 of FIG. 2). I/O Sampling Unit 12 may also de-assert the hold signal along line 30 to Device Handling Unit 14 (act 165 of FIG. 2). It should be appreciated that acts 155, 160, and 165 of FIG. 2 may be performed concurrently or serially in the order indicated in FIG. 2 or, in some embodiments, an alternate order.

Responsive to the receipt of the signal from I/O Sampling Unit 12 at I/O Pad 22a indicating completion of data or signal reading, the chip select indicator signal along line 52 may be reactivated and Device Handling Unit 14 may resume sending data along line 54 to Device A 24. In some embodiments, the chip select indicator signal may be reactivated by Device Handling Unit 14 in response to the de-assertion of the hold signal along line 30 by I/O Sampling Unit 12.

In some embodiments, the state of the chip select indicator signal on line 52 may be controlled by Device Handling Unit 14, or by another circuit element (not shown) in response to a software command.

In accordance with alternate embodiments, circuit 10 need not include a Sampling Timer 20, a Direction Delay Timer 18, or both. In these alternative embodiments, I/O Sampling Unit 12 senses the state of the chip select signal on line 52 directly, by way of line 42, and does not need a grant signal from Device Handling Unit 14 in order to receive an indication of when it may safely access I/O line 64. In these embodiments, the change in state of the chip select indicator signal is sufficient to provide this indication to I/O Sampling Unit 12. For example, in each of these alternative embodiments, after sensing deactivation of the chip select indicator signal on line 52, I/O Sampling Unit 12 sends a direction change signal to I/O Pad 22a along line 44 instructing I/O Pad 22a to change from being an output path for data from Device Handling Unit 14 to Device A 24 to being an input path for data output from Device B 26 to I/O Sampling Unit 12 (act 130 of FIG. 2).

In accordance with one embodiment in which the Direction Delay Timer 18 is used but not the Sampling Timer 20, the I/O Sampling Unit 12 also sends a start signal to Direction Delay Timer 18 and waits for a response from Direction Delay Timer 18 (acts 135 and 140 of FIG. 2). Responsive to receipt of an expiration signal from Direction Delay Timer 18 at act 140, I/O Sampling Unit 12 reads a data value or a signal from line 64 through I/O Pad 22a along line 46 (act 145 of FIG. 2). In this embodiment, waiting for an expiration signal from Direction Delay Timer 18 before the I/O Sampling Unit reads input data helps to ensure that the input data is valid and that the direction of the I/O Pad has been changed.

In an alternative embodiment in which neither the Direction Delay Timer 18 or the Sampling Timer 20 is used, subsequent to sending the direction change signal to I/O Pad 22a along line 44 instructing I/O Pad 22a to change from being an output path to an input path (act 130 of FIG. 2), the I/O Sampling Unit 12 simply reads a data value or a signal from line 64 through I/O Pad 22a along line 46 (act 145 of FIG. 2).

In each of these alternative embodiments, the signal or data value from Device B 26 that is sampled in act 145 may be sampled once, or a number of times as described previously as a form of an error check. Indeed, in those embodiments in which neither a Direction Delay Timer 18 nor a Sampling Timer 20 is used, taking multiple samples of the data value or signal from line 64 helps to ensure that the I/O Pad 22a has had ample time to change direction and that the sampled data is valid. It should be appreciated that in each of the alternative embodiments described above, the I/O Sampling Unit 12 may continue monitoring the status of the chip select indicator signal on line 42 during the act of sampling (act 145 of FIG. 2) to ensure that the sampled data is valid.

Responsive to the sampling of the data value or signal, I/O Sampling Unit 12 writes the data value or sampled signal to Signal Value Register 16 along line 40 (act 155 of FIG. 2). In embodiments where an error check is performed and an error in the data reading act is encountered, the act of writing new data to the Signal Value Register 16 (act 155 of FIG. 2) may be omitted, and the prior value in the Signal Value Register 16 may be maintained. After sampling the data or signal from Device B 26, I/O Sampling Unit 12 sends another signal to I/O Pad 22a instructing I/O Pad 22a to change direction and allow data output from Device Handling Unit 14 to reach Device A 24 (act 160 of FIG. 2).

Figure 3:
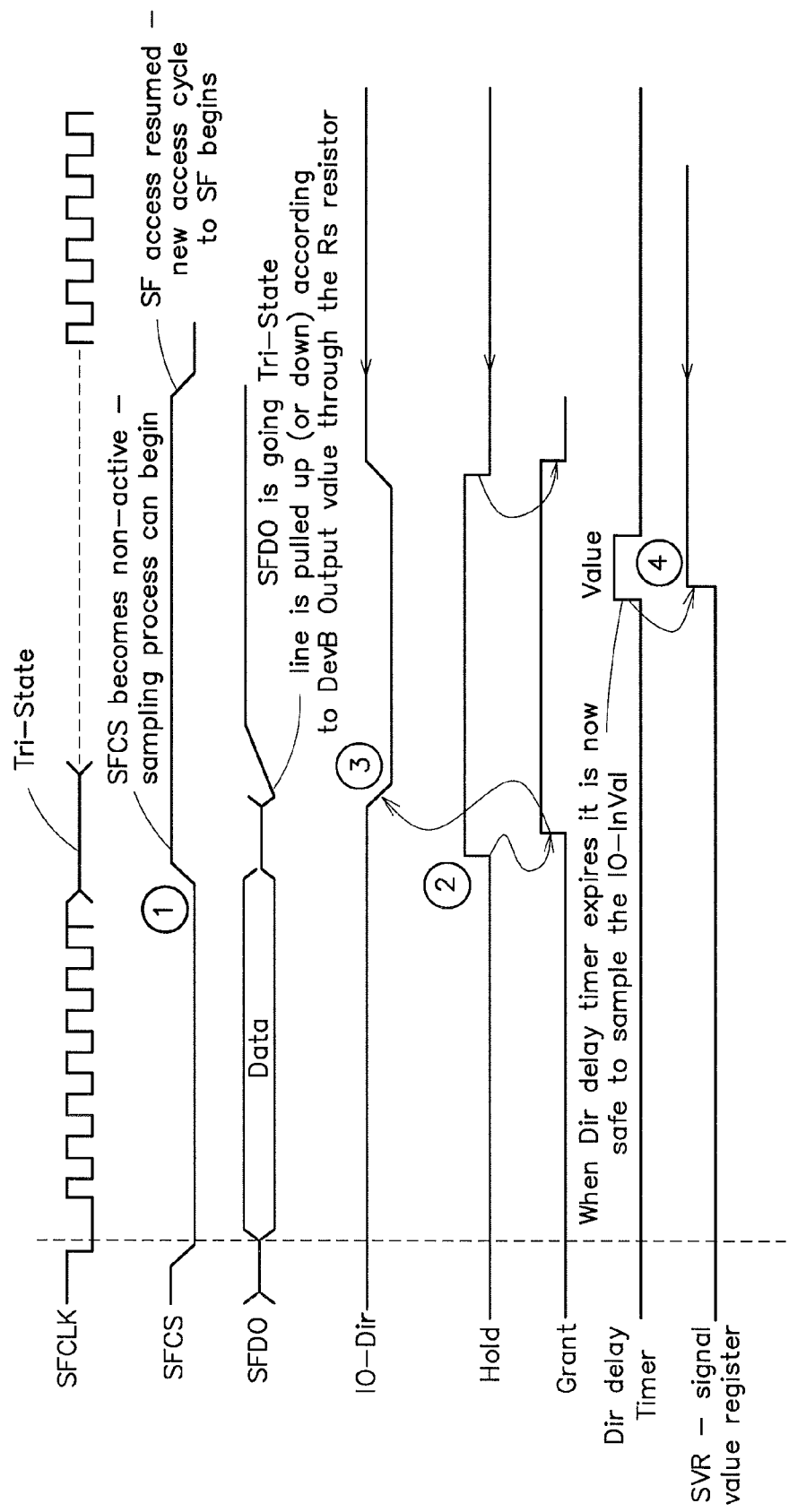
FIG. 3 is a timing diagram of a method of operation of the circuit of FIG. 1 wherein the circuit is configured to communicate with a serial flash memory device.

Referring to FIG. 3, there is illustrated a timing diagram of the operation of circuit 10 according to the flowchart 100 of FIG. 2, specific to an embodiment where Device A 24 is a Serial Flash memory device, and Device Handling Unit 14 is a Serial Flash Handling Unit. At Time 0 (at the left side of the timing chart after the SFCS level drops), a clocking signal SFCLK is being sent from the Serial Flash Handling Unit along lines 48, 58 to the Serial Flash memory device. A Chip Select indicator SFCS (e.g., on lines 52, 62) is in an active state (a lower voltage) indicating that data (SFDO) may be written from the Serial Flash Handling Unit through I/O Pad 22a to the Serial Flash memory device. At this point the I/O direction value on line 44 is at a first level, the hold and grant signals are de-asserted, and the Direction Delay Timer 18 is not active. At time 1 data flow to the Serial Flash memory device from the Serial Flash Handling Unit is completed and chip select indicator SFCS switches to an inactive state. In some embodiments SFCS may change states automatically in response to the completion of data transmission, and in other embodiments SFCS may change states in response to a hold request from I/O Sampling Unit 12 to the Serial Flash Handling Unit. Clocking signal SFCLK may also be halted or tri-stated at this time by the Serial Flash Handling Unit.

At time 2, I/O Sampling Unit 12 asserts a hold signal to the Serial Flash Handling Unit. Because Chip Select signal SFCS is inactive, the Serial Flash Handling Unit responds to I/O Sampling Unit 12 with a grant signal shortly thereafter. Responsive to the assertion of the grant signal, I/O Sampling Unit 12 then changes a state of the direction signal IO-Dir provided to I/O Pad 22a at time 3 to change the direction of the I/O Pad 22a from output to input. At time 3, I/O Sampling Unit 12 also sends a start signal to Direction Delay Timer 18. The delay imposed by Direction Delay Timer 18 allows a sufficient amount of time for the I/O Pad 22a to change direction and may also allow the value of the signal on line 54 to adjust to match the output of Device B 26. At time 4, Direction Delay Timer 18 sends an expiration signal to I/O Sampling Unit 12 and I/O Sampling Unit 12 reads data output or samples a signal from Device B 26 and sends a representation of this data output or signal to Signal Value Register 16.

I/O Sampling Unit 12 then de-asserts the hold signal provided to the Serial Flash Handling Unit and at some time later, the Chip Select indicator signal SFCS reactivates, SFCLK resumes transmitting a clocking signal, and the Serial Flash Handling Unit may resume sending data to the Serial Flash memory device.

Figure 4:
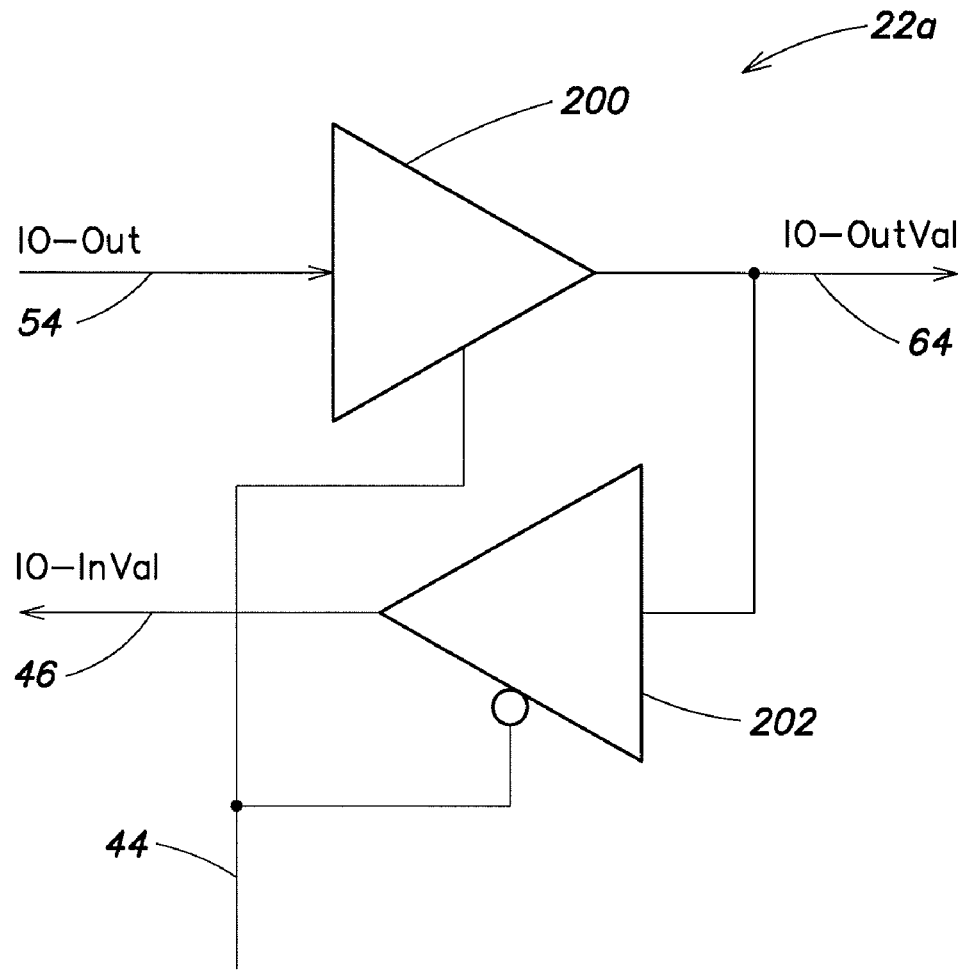
FIG. 4 is a functional diagram of an I/O pad illustrated in FIG. 1.

A functional diagram of an I/O Pad, such as I/O Pad 22*a* is illustrated in FIG. 4. I/O Pad 22*a* may in some embodiments include one or more logic gates which may be utilized to change the direction in which data may flow through I/O Pad 22*a*. I/O Pad 22*a* may include a data buffer 200 and a data buffer 202, each of which may be tri-state buffers. In a first state, for example when line 44 has a high (one) logic level, buffer 200 is enabled and is capable of writing data to line 64, while buffer 202 is disabled and provides a tri-stated output on line 46. In a second state, for example when line 44 has a low (zero) logic level, buffer 200 is disabled and its output on line 64 is tri-stated, and buffer 202 is enabled and is capable of providing a signal value to line 46.

As described above, the various functions of circuit 10 are performed by hardware circuit elements 12, 14, 16, 18, 20, and 22 with limited, if any software control. This results in a device that may quickly switch from driving a pin with an output signal to utilizing that same pin to access an input signal. For example, in an embodiment that does not include Sampling Timer 20 and Direction Delay Timer 18, the signal value produced by Device B 26 may be sensed any time after the chip select signal is de-asserted. Thus, in this embodiment, the I/O Sampling Unit 12 may monitor the chip select signal directly through a hard wired connection, and need not wait for a grant signal from the Device Handling Unit 14 indicating that the output of Device B may now be read.

As noted above, in various embodiments, Sampling Timer 20 may be omitted from circuit 10, and I/O Sampling Unit 12 may initiate procedures to read data from Device B 26 in response to a change (de-assertion) in the chip select signal. In embodiments where Sampling Timer 20 is not present, any or all of acts 105, 110, 115, 125, and 165 may be omitted from the operation illustrated in FIG. 2. In other embodiments Direction Delay Timer 18 may also be omitted and acts 135 and 140 of FIG. 2 may therefore be omitted. It should be appreciated that in embodiments where Sampling Timer 20 and Direction Delay Timer 18 are not present, I/O Sampling Unit 12 may monitor the output of Device B 26 each time the chip select signal on line 52 is not active and may monitor the level of the chip select signal during the period in which data is sampled to ensure its validity. In embodiments where the output signal from Device B 26 does not change rapidly or frequently, this may not be necessary or desirable, whereas if Device B 26 is a more active device with an output that rapidly or frequently changes, this may be beneficial. In some embodiments where Direction Delay Timer 18 is omitted, I/O Sampling Unit 12 may repeatedly sample a data signal from Device B 26 until it receives a specified number of consecutive identical readings before writing data to Signal Value Register 16.

Described below are several pseudocode examples which may be performed by embodiments of the present invention.

EXAMPLE 1

Pseudocode Operation of I/O Sampling Unit without Sampling Timer and Direction Delay Timer

```
If ChipSelect is Not Active for XXX time
  Sample the Data Input (on a general input pad like 22c) for YYY time and
    if Sampled value is consistent
      Write Sampled value to Signal Value Register
    endif
Endif
```

In the above pseudocode example, XXX and YYY may be any time value appropriate to a particular application. Example 1 may be used for any general purpose input pin, such as, for example, I/O Pad 22*c* by connecting another signal line between the pad and the I/O Sampling Unit 12. Because both of the signals are input signals, during the time in which the ChipSelect is active, the signal on I/O Pad 22*c* from Device A 24 would be read by the Device Handling Unit 14, and during periods in which the ChipSelect was inactive, data provided by another device could be read by the I/O Sampling unit, without needing to change the direction of the I/O Pad 22*c*. In this example, I/O Sampling Unit 12 could monitor the ChipSelect signal during sampling to ensure that the data read from the other device was valid.

EXAMPLE 2

Pseudocode Operation of I/O Sampling Unit with Sampling Timer and Direction Delay Timer

```
Whenever SamplingTimer expires do
  Look for sampling opportunity (where the ChipSelect is not active)
  When ChipSelect not active do
    Put Device Handling Unit on hold (can not write to Device A until sample is done)
    Change I/O dir to input
    Wait for DirDelayTimer
      Sample the input 3 times
      If all 3 times are the same
        Set SignalValueRegister to new value
      Else
        Keep SignalValueRegister without change
    End Wait (for DirDelayTimer)
    Change I/O dir to output
    Release Device Handling Unit (can access (e.g. read from or write to) Device A now)
  End When (ChipSelect not active)
End Whenever (SamplingTimer expires)
```

The above pseudocode example, which reflects the operation of the I/O Sampling Unit previously described with respect to FIG. 2, may be used to sample an input from another device (e.g., Device B in FIG. 1) on any general purpose output pin, such as I/O Pad 22*a* that is connected to another device (e.g., Device A in FIG. 1).

EXAMPLE 3

Pseudocode Operation of I/O Sampling Unit without Sampling Timer but with Direction Delay Timer

```
Whenever ChipSelect is not active for DirDelayTimer time
  Sample the input 3 times
  If all 3 times are the same
    Set SignalValueRegister to new value
  Else
    Keep SignalValueRegister without change
End Whenever (ChipSelect is not active for DirDelayTimer time)
```

The above pseudocode example may be used for any general purpose input pin, such as, for example, I/O Pad 22*c* by connecting another signal line between the pad and the I/O Sampling Unit 12. Because both of the signals are input signals, during the time in which the ChipSelect is active, the signal on I/O Pad 22c from Device A 24 would be read by the Device Handling Unit 14, and during periods in which the ChipSelect was inactive, data provided by another device could be read by the I/O Sampling unit, without needing to change the direction of the I/O Pad 22c. In this example, I/O Sampling Unit 12 could monitor the ChipSelect signal during sampling to ensure that the data read from the other device was valid. Advantageously, this embodiment permits the I/O Sampling Unit 12 to read data from other devices (e.g., other than Device A 24 and Device B 26) during the same time that it may be reading the output provided by Device B 26 via I/O Pad 22a. It should be appreciated that for this purpose, an additional Signal Value Register would be provided for each additional input signal that was desired to be read.

Having thus described several aspects of at least one embodiment of this invention, it is to be appreciated various alterations, modifications, and improvements will readily occur to those skilled in the art. For example, circuit 10 may be one where an I/O pad that is normally dedicated as an input may be occasionally utilized as an output. Circuit 10 may in alternate embodiments include multiple I/O pads which may be switched between input and output modes. Circuit 10 may in some embodiments be utilized to control or monitor more than two devices. In further alternate embodiments, one or more I/O pads of circuit 10 may switch between providing output to one device to providing output to another device or devices or one or more I/O pads of circuit 10 may switch between reading input signals from one device to reading input signals from another device or devices.

The signal paths described above between the various circuit elements and external devices should not be considered to be limited to physical electrical connections such as conductive wires. In alternate embodiments one or more of these signal paths may be realized in a form that may, for example, carry an optical signal or transmit and/or receive an RF signal. Such alterations, modifications, and improvements are intended to be part of this disclosure, and are intended to be within the scope of the present invention. Accordingly, the foregoing description and drawings are by way of example only.

What is claimed is:

1. An integrated circuit having a plurality of terminals, comprising:
   a memory;
   a first terminal to provide a first output signal to a first device and to receive a first input signal from a second device;
   a second terminal to provide a second output signal having a first logic level indicative of when the first terminal is providing the first output signal and having a second logic level indicative of when the first terminal is not providing the first output signal; and
   a logic circuit, coupled to the first terminal, the second terminal, and the memory, and configured to sense a value of the first input signal and store the value in the memory in response to the second output signal having the second logic level and in the absence of a request from either the first device or the second device.

2. The integrated circuit of claim 1, wherein the first device is a first external serial flash memory device and wherein the second device is a second external device different than the first external serial flash memory device.

3. The integrated circuit of claim 1, wherein the logic circuit comprises a sampling unit and a device handling unit, wherein the sampling unit is configured to sense the value of the first input signal and store the value in the memory, and wherein the device handling unit provides the first output signal to the first terminal.

4. The integrated circuit of claim 3, wherein the sampling unit controls the state of the second output signal.

5. The integrated circuit of claim 3, further comprising a delay timer in electrical communication with the sampling unit, wherein responsive to an indication from the sampling unit that the second output signal has the second logic level, the delay timer waits for a determined amount of time before providing a timer signal to the sampling unit, and wherein responsive to receipt of the timer signal, the sampling unit senses the value of the first input signal and stores the value in the memory.

6. The integrated circuit of claim 5, further comprising a sampling timer in electrical communication with the sampling unit, wherein the sampling timer periodically provides a sampling signal to the sampling unit, and wherein the sampling unit is further configured to sense the value of the first input signal and store the value in the memory in response to the second output signal having the second logic level and receipt of the sampling signal.

7. The integrated circuit of claim 6, further comprising a microprocessor in electrical communication with the device handling unit.

8. The integrated circuit of claim 7, wherein the sampling unit, the device handling unit, the delay timer, the sampling timer, the memory, and the microprocessor are fabricated on a single die and packaged in a single package that includes the first terminal and the second terminal.

9. The integrated circuit of claim 7, wherein the sampling unit, the device handling unit, the delay timer, and the sampling timer are fabricated on a single die and packaged separately from at least one of the memory and the microprocessor.

10. The integrated circuit of claim 7, wherein the memory is a register of the microprocessor.

11. The integrated circuit of claim 1, further comprising:
    a first buffer having an input electrically coupled to the logic circuit, an output electrically coupled to the first terminal, and an enable input; and
    a second buffer having an input electrically coupled to the first terminal, an output electrically coupled to the logic circuit, and an enable input electrically coupled to the enable input of the first buffer and to the logic circuit;
    wherein an enable signal provided to the enable input of the first buffer and the enable input of the second buffer enables the first buffer and disables the second buffer in a first state and disables the first buffer and enables the second buffer in a second state.

12. A method of processing signals in a circuit having a plurality of terminals, comprising acts of:
    providing a first signal to a first device on a first terminal of the circuit during a first interval in which a second terminal of the circuit has a voltage level corresponding to a first logic level;
    receiving a second signal indicative of whether the voltage level of the second terminal corresponds to a second logic level, different than the first logic level;
    reading, responsive to the act of receiving the second signal and in the absence of receiving a request from the first device or a second device, a third signal from the second device on the first terminal during a second interval; and
    storing a representation of the third signal in a memory.

13. The method of claim 12, wherein the act of reading the third signal during the second interval is performed in response to receiving a periodic signal from a first timer.

14. The method of claim 12 further comprising acts of:
receiving a periodic signal from a first timer; and
requesting, responsive to the act of receiving the periodic signal, a third device that provides the first signal to provide the second signal when the voltage level of the second terminal corresponds to the second logic level.

15. The method of claim 14, further comprising acts of:
changing a direction of the first terminal to permit the third signal to be read during the second interval; and
waiting, for a determined period of time to allow the direction of the first terminal to change, prior to the act of reading the third signal.

16. The method of claim 15, wherein the act of reading the third signal during the second interval includes an act of reading the third signal at each of a plurality of successive times during the second interval.

17. The method of claim 16, wherein the act of storing the representation of the third signal in the memory is performed in response to a value of the third signal being the same for at least two successive times.

18. The method of claim 12, further comprising an act of:
monitoring the second signal, during the act of reading the third signal, to ensure that the voltage level of the second terminal corresponds to the second logic level.

19. The method of claim 18, wherein the act of reading the third signal during the second interval includes an act of reading the third signal at each of a plurality of successive times during the second interval.

20. The method of claim 19, wherein the act of storing the representation of the third signal in the memory is performed in response to a value of the third signal being the same for at least two successive times.

21. The method of processing signals of claim 12, wherein the act of providing the first signal includes an act of providing an enable signal having a first state to an enable input of a first buffer, enabling the first buffer to provide the first signal to the first device, and wherein the act of reading the third signal includes an act of providing the enable signal having a second state to the enable input of the first buffer and an enable input of a second buffer, disabling the first buffer and enabling the second buffer to allow reading of the third signal from the second device.

22. An electronic system comprising:
a first input/output pad having a first state in which data can be provided to a first electronic circuit and having a second state during which a signal can be received from a second electronic circuit, different than the first electronic circuit;
a second input/output pad to provide a control signal having a first logic level during which the data can be provided to the first electronic circuit and having a second logic level during which the signal can be received from the second electronic circuit;
a device control circuit, electrically coupled to the first input/output pad and to the second input/output pad, the device control circuit configured to control the data provided to the first electronic circuit via the first input/output pad;
a memory to store a value of the signal received from the second electronic circuit; and
a sampling circuit, electrically coupled to the device control circuit, the memory, the first input/output pad, and the second input/output pad, the sampling circuit comprising circuitry configured to change the logic level of the control signal from the first logic level to the second logic level and, in the absence of a request from either the first electronic circuit or the second electronic circuit, to sample the value of the signal received from the second electronic circuit and write the value of the signal to the memory.

23. The electronic system of claim 22, wherein the first input/output pad includes:
a first buffer having an input electrically coupled to the device control circuit, an output electrically coupled to the first electronic circuit, and an enable input electrically coupled to the circuitry configured to change the state of the first input/output pad; and
a second buffer having an input electrically coupled to the second electronic circuit, an output electrically coupled to the sampling circuit, and an enable input electrically coupled to the enable input of the first buffer and to the circuitry configured to change the state of the first input/output pad.

* * * * *